US008110246B2

(12) United States Patent
Klein et al.

(10) Patent No.: US 8,110,246 B2
(45) Date of Patent: Feb. 7, 2012

(54) METHOD FOR PRODUCING A THIN-FILM SOLAR CELL BY USE OF MICROCRYSTALLINE SILICON AND A LAYER SEQUENCE

(75) Inventors: Stefan Klein, Kahl am Main (DE); Yaohua Mai, Hebei (CN); Friedhelm Finger, Jülich (DE); Reinhard Carius, Jülich (DE)

(73) Assignee: Forschungszentrum Julich GmbH, Julich (DE)

( * ) Notice: Subject to any disclaimer, the term of this patent is extended or adjusted under 35 U.S.C. 154(b) by 699 days.

(21) Appl. No.: 11/793,690

(22) PCT Filed: Dec. 13, 2005

(86) PCT No.: PCT/DE2005/002237
§ 371 (c)(1),
(2), (4) Date: Sep. 17, 2008

(87) PCT Pub. No.: WO2006/066544
PCT Pub. Date: Jun. 29, 2006

(65) Prior Publication Data
US 2009/0007964 A1    Jan. 8, 2009

(30) Foreign Application Priority Data

Dec. 21, 2004   (DE) .................. 10 2004 061 360

(51) Int. Cl.
*H01L 31/028* (2006.01)
(52) U.S. Cl. .............. 427/74; 427/574; 438/87; 438/97; 136/261

(58) Field of Classification Search .......... 136/250–265; 438/57, 63
See application file for complete search history.

(56) References Cited

U.S. PATENT DOCUMENTS

| | | | | |
|---|---|---|---|---|
| 5,942,049 A | * | 8/1999 | Li et al. .......... | 136/258 |
| 6,124,545 A | * | 9/2000 | Bauer et al. .......... | 136/255 |
| 2004/0089874 A1 | * | 5/2004 | Negami et al. .......... | 257/103 |

FOREIGN PATENT DOCUMENTS

DE    34 41 044 A1    11/1984

OTHER PUBLICATIONS

J. Rath et al; Application of hot-wire chemical vapor . . . ; Thin Solid Films 395 (2001) 320-329.
M.K. van Veen et al; Incorporation of amorphous and microcrystalline . . . ; Thin Solid Films 430 (2003) 216-219.
R.E.I. Schropp; Present status of micro- and polycrystalline . . . ; Thin Solid Films 451-452 (2004) 455-465.
Schropp et al: "Thin Film a-Si/poly-Si Multibandgap Tandem Solar Cells with Both Absorber Layers Deposited by Hot Wire CVD", Material Research Society Symposium Proceedings, Spring 2001, pp. A15.6.1-A15.6.6.

* cited by examiner

*Primary Examiner* — Jeffrey T Barton
*Assistant Examiner* — Jayne Mershon
(74) *Attorney, Agent, or Firm* — Jonathan Myers; Andrew Wilford

(57) ABSTRACT

The invention relates to a method for production of a thin-layer solar cell with microcrystalline silicon and a layer sequence. According to the invention, a microcrystalline silicon layer is applied to the lower p- or n-layer in pin or nip thin-layer solar cells, by means of a HWCVD method before the application of the microcrystalline i-layer. The efficiency of the solar cell is hence increased by up to 0.8% absolute.

14 Claims, 1 Drawing Sheet

METHOD FOR PRODUCING A THIN-FILM SOLAR CELL BY USE OF MICROCRYSTALLINE SILICON AND A LAYER SEQUENCE

CROSS REFERENCE TO RELATED APPLICATIONS

This application is the US national phase of PCT application PCT/DE2005/002237, filed 13 Dec. 2005, published 29 Jun. 2006 as WO 2006/066544, and claiming the priority of German patent application 102004061360.5 itself filed 21 Dec. 2004, whose entire disclosures are herewith incorporated by reference.

FIELD OF THE INVENTION

The invention relates to a method for producing a thin-film solar cell by use of microcrystalline silicon and a layer sequence.

BACKGROUND OF THE INVENTION

Microcrystalline thin-film solar cells comprise various layers of silicon that differ in their doping and degree of crystallinity. The layers are deposited on substrates such as glass. Various methods are known for this purpose. In the PECVD method a gas mixture is decomposed into fragments in a plasma, and in the HWCVD method the gas or gas mixture is decomposed by heating a wire. In both methods decomposition products deposit on the substrate, resulting in a coating. The photo-CVD method and sputtering, known from the prior art, may also be used to deposit layers on surfaces.

A distinction is made between pin cells and nip cells, that differ in their layer sequence.

In a pin solar cell the layer adjoining the transparent substrate is a p-layer, i.e. a p-doped silicon layer; the i-layer is located on the p-layer and is not doped. The n-layer, that is n-doped, is located on the i-layer. In a nip solar cell the p-layer and the n-layer are exchanged with one another, and likewise include an i-layer.

The microcrystalline p-layer is p-doped silicon that is doped with boron, for example.

One skilled in the art is familiar with the manner in which these layers are deposited.

For a p-layer, gas mixtures containing silicon compounds, positively doped compounds such as boron compounds, as well as hydrogen gas are used that are decomposed and deposited on the surface. The resulting layer is microcrystalline. The known HWCVD, PECVD, and photo-CVD methods may be used for this purpose.

For the deposition of the microcrystalline i-layer, a mixture comprising a silicon compound and hydrogen is decomposed, whereupon a microcrystalline Si layer is deposited. The known HWCVD, PECVD, sputtering, and photo-CVD methods may likewise be used for this purpose.

For the deposition of the microcrystalline n-layer, a mixture comprising a silicon-containing compound, hydrogen, and negatively doped compounds such as phosphorus-containing compounds is decomposed. The HWCVD, PECVD, and photo-CVD methods may be used here as well.

According to one known method, thin-film solar cells are deposited onto transparent substrates by means of PECVD. The deposition sequence is pin or also nip, the individual layers generally being deposited in different cavities. For PECVD the microcrystalline layers are deposited by use of various possible excitation frequencies, such as radio frequencies, microwave, or very high frequency (VHF). High plasma outputs are necessary for achieving high deposition rates by means of PECVD. The HWCVD method requires high wire temperatures for achieving high deposition rates. Solar cells having a low fill factor and a low open circuit voltage have heretofore been produced at high deposition rates. The HWCVD method is also much more time-intensive than the PECVD method. Solar cells having very high Voc and FF may be obtained at low substrate temperatures.

OBJECT OF THE INVENTION

The object of the invention is to provide a method for producing solar cells that results in solar cells having higher efficiency, in particular higher Voc and FF. An aim is to increase the open circuit voltage of the solar cells by use of the method.

A further aim is to provide a layer sequence having characteristics that allow higher open circuit voltages and fill factors. It should be possible to carry out the method in the shortest possible time.

SUMMARY OF THE INVENTION

The method according to the invention may be used to produce pin and nip solar cells based on microcrystalline silicon that have a higher efficiency, i.e. a higher open circuit voltage (Voc) and a higher fill factor (FF).

Advantageous refinements of the invention are described in the subclaims.

The invention is explained below.

For the production of the solar cells or layer sequences according to the invention, in a first step a transparent current-conducting layer is deposited on a transparent substrate, for example glass or plastic, which is referred to in the technical field as a TCO layer. This layer typically has a layer thickness of 0.5-2 µm, and may have, but is not limited to, the following composition: $SnO_2$, ZnO, ITO.

The deposition may be carried out using conventional methods, for example sputtering or CVD.

The method according to the invention is explained below for a pin solar cell. However, the invention also encompasses the production of a nip solar cell. In the production of the latter the same steps are carried out, except that the sequence of application of the p-layer and the n-layer is reversed.

In a further step, on the TCO layer a microcrystalline p-layer is deposited onto the transparent substrate together with the superposed TCO layer, preferably by use of the PECVD method. However, the deposition may also be performed using other methods known from the prior art, such as the HWCVD method, sputtering, or the photo-CVD method.

This step is carried out using method parameters and gas mixtures known to one skilled in the art.

Gas mixture components comprise a silicon-containing compound, hydrogen, and a compound that deposits a substance that results in p-doping.

The silicon-containing compound may be, but is not limited to, at least one component from the group comprising $SiH_4$, methyl silane, dimethyl silane, trimethyl silane, tetramethyl silane, disilane, trisilane, or halosilanes such as $HSiCl_3$, $H_2SiCl_2$, $H_3SiCl_1$, $SiCl_4$, or the corresponding fluorine compounds.

The concentration of the silicon compounds is, for example, between 0.1% and 10%.

The total pressure may be, for example, between 0.2 hPa and 20 hPa.

The compound that deposits the component that results in p-doping may be, but is not limited to, at least one component of the group comprising diborane, trimethylborane, or organyl compounds of Ga and Al, such as trimethyls or triethyls.

The concentration of the p-doped compound is, for example, between 0.1% and 2%, relative to the silicon-containing compound.

The gas mixture, which comprises the silicon-containing compound, the compound that deposits the component that results in p-doping, and hydrogen as substitutes is decomposed by means of the PECVD method or another method such as the HWCVD method or the photo-CVD method, and the resulting components deposit in the form of a microcrystalline p-doped silicon layer.

The substrate temperature may, for example, be between 50° C. and 300° C.

The depositing layers have a layer thickness of 2 nm-100 nm, preferably 5 nm-30 nm, particularly preferably 10 nm-20 nm.

In the next step, according to the invention a microcrystalline silicon layer is deposited by the HWCVD method. Surprisingly, it has been shown that the deposition of a layer of microcrystalline silicon by the HWCVD method results in an increase in the open circuit voltage and the fill factor, and thus the efficiency of solar cells. The layer thickness of the layer deposited by means of the HWCVD method may be 2 nm-200 nm, preferably 5 nm-50 nm, particularly preferably 10 nm-20 nm.

For the deposition of the above-referenced layer, a gas comprising hydrogen and a silicon-containing compound that may be, but is not limited to, $SiH_4$, disilane, trisilane, or halosilanes such as $HSiCl_3$, $H_2SiCl_2$, $H_3SiCl_1$, $SiCl_4$, or the corresponding fluorine compounds is used.

For carrying out the method step according to the invention, the parameters preferably are, but are not limited to, the following:

Wire material: tungsten, tantalum, graphite, rhenium, or osmium, or high-melting materials.

Wire temperature: 1200° C.-2200° C. (or preferably 1500°-1800° C.)

Substrate temperature: <400° C. (<300° C. in pin)

Pressure: 1 Pa-100 Pa (or preferably 2 Pa-10 Pa)

Hydrogen dilution: 0.1%-20% silane in hydrogen.

The layer produced according to these parameters (produced by HWCVD) has a thickness of 2 nm-200 nm, preferably 5 nm-20 nm, and has a crystallinity of >0%.

The substrate temperatures are preferably between 50° C. and 300° C., particularly preferably between 150° C. and 200° C.

The gas concentrations are, for example, 0.1-10% silane or silicon-containing compound, relative to hydrogen.

The total pressure range is between 1 Pa and 100 Pa.

This microcrystalline silicon layer applied as an intermediate layer causes the overall solar cell to have a higher open circuit voltage and a higher fill factor, and thus a higher efficiency. This layer forms a part of the microcrystalline i-layer that is applied to the p-doped layer.

The absolute efficiency is increased by up to 0.8%, the open circuit voltage by up to 25 mV, and the fill factor by up to 3%.

In a further step, preferably by use of the PECVD method, an additional microcrystalline silicon i-layer is deposited. In this method step, the same as for the other steps, alternative methods such as HWCVD, sputtering, or photo-CVD may be used.

In principle, the deposition may be carried out using the same components as for the deposition of the intermediate layer.

The compounds used for the deposition are hydrogen and at least one component from the group comprising, but not limited to, $SiH_4$, disilane, trisilane, or halosilanes such as $HSiCl_3$, $H_2SiCl_2$, $H_3SiCl_1$, $SiCl_4$, or the corresponding fluorine compounds.

This layer preferably has a crystallinity of >20%.

The silane concentrations or the concentration of the silicon-containing compound may be, for example, 0.1%-100%. Hydrogen may optionally be present.

The temperature range is preferably 50-400° C., particularly preferably 150° C.-200° C. for pin layer sequences, or 150°-250° C. for nip layer sequences.

The total pressure is, for example, between 0.2 hPa and 20 hPa.

The layer thickness of the microcrystalline i-layer deposited by the PECVD method is preferably between 0.2 μm and 10 μm, particularly preferably between 0.5 μm and 2 μm.

Characteristics of the i-layer:

Produced by PECVD (RF, VHF, microwave, etc.)

Thickness: preferably 0.5 μm-5 μm

Crystallinity: >20%.

The layer deposited by use of the HWCVD method and the PECVD method forms an i-layer of microcrystalline silicon, which compared to an i-layer according to the prior art allows a higher open circuit voltage, a higher fill factor, and a higher efficiency.

An n-layer is deposited on the i-layer.

The n-layer may be amorphous or microcrystalline.

To this end, a gas mixture comprising a silicon-depositing compound, optionally hydrogen, and a component that causes n-doping is used.

The component used as the silicon-depositing component may for example be, but is not limited to, $SiH_4$, methyl silane, dimethyl silane, trimethyl silane, tetramethyl silane, or $HSiCl_3$, $H_2SiCl_2$, $H_3SiCl_1$, or $SiCl_4$.

Phosphine, for example, may be used as an n-doping compound.

The deposition of the n-doped layer may be carried out using the PECVD method, photo-CVD method, sputtering, or HWCVD method, for example.

The layer thickness of the n-layer is preferably between 5 nm and 50 nm, particularly preferably between 10 nm and 30 nm.

The preferred coating temperatures are between 100° C. and 400° C.

The total pressure is typically between 0.2 hPa and 20 hPa.

The concentration of the silicon-containing compound in the gas phase is between 0.1% and 100%.

Phosphine is used in a concentration range that is preferably between 0.1% and 5%, relative to silane or the silicon-containing compound.

The percentage values in each case refer to volume percent.

The topmost layer, i.e. for pin the n-layer and for nip the p-layer, is usually coated with a reflective layer. This reflective layer may, for example, be composed of a TCO layer and a metal layer made of Ag or Al, for example.

The invention also encompasses stacks of layers that contain the layer sequence according to the invention at least once.

The invention also encompasses layer sequences having the following patterns:

A) a microcrystalline p-layer,
   a microcrystalline intrinsic silicon layer applied by the HWCVD method,
   an i-layer applied by the PECVD method, and
   a microcrystalline or amorphous n-layer or also a thin-film solar cell comprising:

a transparent substrate,
a TCO layer,
a microcrystalline p-layer,
a microcrystalline intrinsic silicon layer applied by the HWCVD-method,
an i-layer applied by the PECVD method,
a microcrystalline or amorphous n-layer, and
a reflective layer.

B) a microcrystalline n-layer.
a microcrystalline intrinsic silicon layer applied by the HWCVD method,
an i-layer applied by the PECVD method, and
a microcrystalline or amorphous p-layer or also a thin-film solar cell comprising:
a transparent substrate,
a TCO layer,
a microcrystalline n-layer,
a microcrystalline intrinsic silicon layer applied by the HWCVD method,
an i-layer applied by the PECVD method,
a microcrystalline or amorphous p-layer, and
a reflective layer.

The p, n, and TCO layers are conventional, and are not limited to the parameters and production methods illustrated in the description.

EXAMPLE

A 5-50 nm thick intrinsic HW layer was deposited on the p-layer that had been deposited onto a ZnO substrate by VHF-PECVD. This layer was deposited at a wire temperature of 1650° C., 3.5 Pa, and 2-10% silane in hydrogen, at a deposition rate of 1-2 Å/s. The production of the solar cell was continued with the deposition of the i-layer by VHF-PECVD at a high growth rate. The open circuit voltage was thus increased by 20 mV, the fill factor by 0.2%, and the absolute efficiency by 0.8%.

DETAILED DESCRIPTION OF THE DRAWING

Figure 1:
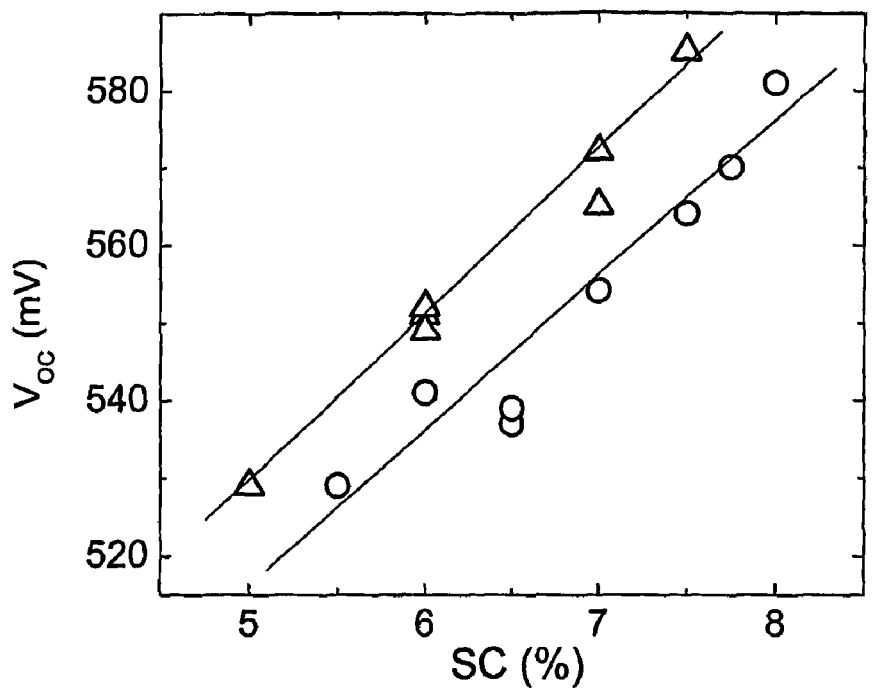
FIG. 1 is a set of two graphs in which silane concentration for the i layer deposition of the thin film solar cell is plotted on the abscissa in % and the open circuit voltage for the cell is plotted on the ordinate. One graph shows the results obtained with the additional intermediate i layer according to the invention and the other graphs shows the results for a cell without the additional intermediate i layer.

The advantageous characteristics of the solar cell according to the invention are shown in the figures:

FIG. 1 illustrates the comparison of the open circuit voltages of pin solar cells with and without the intermediate layer according to the invention.

The silane concentration for the i-layer deposition is plotted on the abscissa in %.

The ordinate shows the open circuit voltages obtained, in mV.

The circles represent solar cells without the intermediate layer according to the invention, and the triangles represent solar cells with the intermediate layer according to the invention. It is seen that the open circuit voltage is increased according to the invention.

Figure 2:
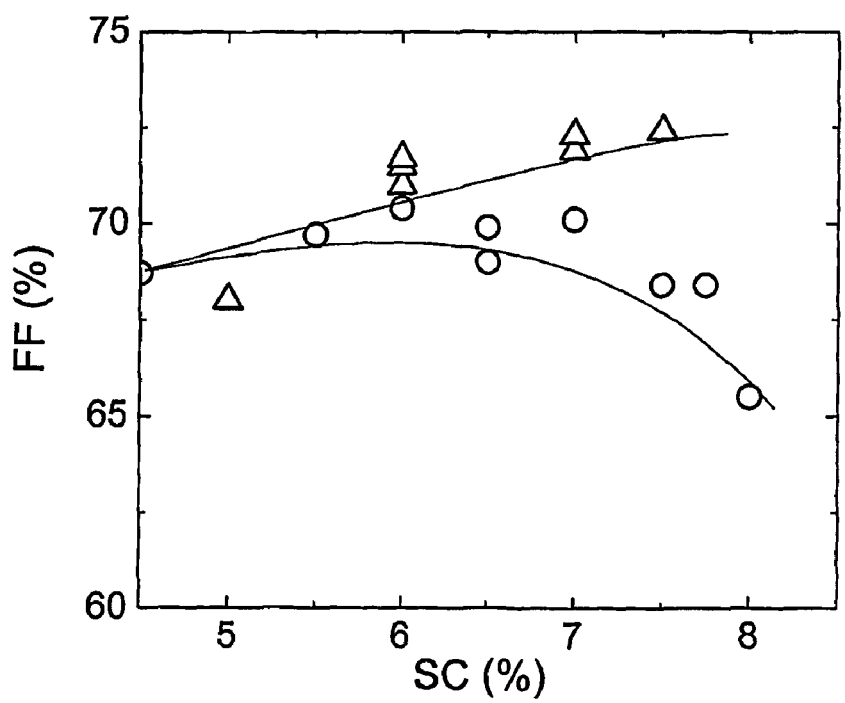
FIG. 2 is a set of two graphs in which silane concentration fpor the i layer deposition of the thin film solar cell is plotted on the abscissa in % and the fill factor for the cell is plotted on the ordinate. One graph shows the results obtained with the additional intermediate i layer according to the invention and the other graphs shows the results for a cell without the additional intermediate i layer.

FIG. 2 shows the comparison of the fill factors of pin solar cells with and without the intermediate layer according to the invention.

The silane concentration for the i-layer deposition is plotted on the abscissa in %.

The ordinate shows the fill factors obtained, in %.

The circles represent solar cells without the intermediate layer according to the invention, and the triangles represent solar cells with the intermediate layer according to the invention. It is seen that the fill factors are increased according to the invention.

The invention claimed is:

1. A method of producing a thin-film solar cell in which a pin or nip layer sequence is produced, further comprising the steps of successively depositing the following layers on a substrate:
   a) a microcrystalline p- or n-layer,
   b) an intermediate microcrystalline silicon I-layer applied by a hot-wire chemical-vapor deposition (HWCVD) method on the microcrystalline p- or n-layer a),
   c) an additional I-layer of microcrystalline silicon, which is formed by depositing on the intermediate microcrystalline silicon I-layer, by a plasma enhanced chemical vapor deposition (PECVD), a sputtering process, or a photo-CVD method whereby layers b) and c) together form an i-layer, and
   d) if a p-layer is present as the layer of step a), an n-layer, and if an n-layer is present as the layer of step a), a p-layer that is either microcrystalline or amorphous.

2. The method according to claim 1 wherein the layer of step b) is applied in a layer thickness of 2 nm-200 nm.

3. The method according to claim 2 wherein the layer of step b) is applied in a layer thickness of 5 nm-50 nm.

4. The method according to claim 2 wherein the layer of step b) is applied in a layer thickness of 10 nm-20 nm.

5. The method according to claim 1 wherein the deposition of the layer of step b) is carried out using at least one silicon compound selected from the group consisting of $SiH_4$, disilane, trisilane, and halosilanes.

6. The method according to claim 1, wherein according to step b), in the HWCVD method, a wire is employed composed of materials selected from the group consisting of: tungsten, tantalum, graphite, rhenium, and osmium.

7. The method according to claim 6 wherein the wire for producing the layer of step b) is heated to a temperature of 1200° C. to 2200° C.

8. The method according to claim 1, wherein the substrate is heated or cooled to a temperature in the production of the layer of step b) <400° C.

9. The method according to claim 1, wherein according to step b), a process pressure is maintained in the production of the layer of step b) of 1 Pa-100 Pa.

10. The method according to claim 9 wherein the process pressure is 2 Pa-10 Pa.

11. The method according to claim 5 wherein a gas concentration of the silicon compound is set at 0.1%-20% by volume.

12. The method according to claim 1, further comprising the step of setting a substrate temperature between 50° C. and 300° C.

13. The method according to claim 12 wherein the substrate temperature is set between 150° C. and 200° C.

14. The method of producing a thin-film solar cell defined in claim 1 wherein according to step c), the additional i-layer of microcrystalline silicon, is formed by depositing on the intermediate microcrystalline silicon i-layer b), by a plasma enhanced chemical vapor deposition (PECVD) whereby the intermediate silicon i-layer b) and the additional i-layer of microcrystalline silicon c) together form an i-layer.

* * * * *